United States Patent [19]

Schüppert et al.

[11] Patent Number: 5,280,189
[45] Date of Patent: Jan. 18, 1994

[54] SEMICONDUCTOR ELEMENT WITH A SILICON LAYER

[75] Inventors: Bernd Schüppert; Armin Splett; Joachim Schmidtchen; Klaus Petermann, all of Berlin, Fed. Rep. of Germany

[73] Assignee: Siemens Aktiengesellschaft, Munich, Fed. Rep. of Germany

[21] Appl. No.: 941,051

[22] PCT Filed: Apr. 8, 1991

[86] PCT No.: PCT/DE91/00303
§ 371 Date: Dec. 2, 1992
§ 102(e) Date: Dec. 2, 1992

[87] PCT Pub. No.: WO91/15798
PCT Pub. Date: Oct. 17, 1991

[30] Foreign Application Priority Data

Apr. 9, 1990 [DE] Fed. Rep. of Germany ....... 4011860

[51] Int. Cl.[5] .................... H01L 29/165; H01L 31/00
[52] U.S. Cl. .................... 257/458; 257/184; 359/248; 385/2; 385/14
[58] Field of Search ............... 257/184, 458; 359/248; 385/2, 14

[56] References Cited

U.S. PATENT DOCUMENTS 5,107,538  4/1992  Benton et al. .................... 385/14

Primary Examiner—Jerome Jackson
Attorney, Agent, or Firm—Kenyon & Kenyon

[57] ABSTRACT

In a semiconductor element is shown having a silicon layer, a waveguide comprising silicon and a diode structure connected with external, conductive contacts. The diode structure is provided in such an arrangement to the waveguide that the diode structure can be influenced by electron hole pairs generated by photons in the waveguide. In order to create a semiconductor element with an optical waveguide and an integrated diode structure, in which high losses in the optical waveguide are avoided, the waveguide is weakly doped, and a germanium-rich layer is a component of the diode structure. The semiconductor element is well suited as a component in integrated optics for optical-electrical conversion.

33 Claims, 2 Drawing Sheets

SEMICONDUCTOR ELEMENT WITH A SILICON LAYER

The invention relates to an optoelectronic semiconductor element with a silicon layer, with an optical waveguide containing silicon in the region of a surface of the silicon layer, and with a diode structure connected with external, conductive contacts in the region of the same surface of the silicon layer, in such an arrangement to the waveguide that the diode structure can be influenced by electron hole pairs generated by photons in the waveguide.

In a known semiconductor element of this type ("IEEE Electron Device Letters," Col. EDL-7, No. 5, May 1986, p. 330-332), an optical wave is guided in an absorbent waveguide, which is arranged in the region of a surface of a silicon layer and composed alternately of silicon and germanium/silicon layers. For the waveguide, a diode structure connected with external contacts is provided, in such an arrangement that the diode structure can be influenced in its electrical conductivity by means of electron hole pairs generated by photons in the waveguide. The waveguide is surrounded by layers with high doping. The high doping leads to high losses due to the absorption of free charge carriers. The known semiconductor element is therefore unsuitable for use as a component representing a combination of an integrated waveguide with a photodetector.

The invention is therefore based on the task of indicating an optoelectronic semiconductor element on the basis of silicon, which contains a low-loss optical waveguide and is therefore well suited for optical-electrical conversion.

To accomplish this task, the waveguide in a semiconductor element of the type stated initially is weakly doped, avoiding high losses due to free charge carriers, and a germanium-rich layer which gives off the electron hole pairs and is arranged adjacent to the waveguide is a component of the diode structure.

While it is known from the publication "Monolithic Integration of Photodiodes and Buried Stripe Waveguides on InP" by R. Kaiser et waveguide and is, therefore, well suited for optical-electrical conversion.

SUMMARY OF THE INVENTION

This and other needs are satisfied by the semiconductor element of the present invention. The waveguide in a semiconductor element similar to the one described above is weakly doped avoiding high losses due to free charge carriers. A germanium-rich layer, which gives off electron hole pairs and is arranged adjacent to the waveguide, is a component of the diode structure.

In the publication "Monolithic Integration of Photodiodes and Buried Stripe Waveguides on InP" by R. Kaiser et al., in Proceedings, 15th European Conference on Optical Communication, Vol. 1 Sep. 1989, p. 360-363, a semiconductor element is provided which contains a waveguide and a photodetector. This semiconductor element is essentially composed of III/V semiconductors. Therefore, these semiconductors involve semiconductor materials which are very complicated to structure, so that this semiconductor element is relatively complicated in production.

A significant advantage of the semiconductor element according to the present invention is that it can be produced over a wide-spread silicon material, and therefore can be produced in a relatively inexpensive manner. In a silicon material, high losses due to free charge carriers are avoided due to the weak doping of the optical waveguide. In this connection, the germanium content in the germanium-rich layer is selected in such a way that the band distance becomes sufficiently small so that photons in the optical waveguide lead to electron hole pairs in the germanium-rich layer, which results in separation of the electrons and the holes by the combination of the germanium-rich layer and the diode structure.

In the semiconductor element according to the invention, it is advantageous if the diode structure in an optical waveguide, located at a surface of the semiconductor element, extends perpendicular to the waveguide in the region of this surface of the silicon layer. Such a structure has the advantage that damping of the optical wave at the metal of the external conductive contacts is avoided, because these contacts can be affixed relatively far away from the optical waveguide in this embodiment of the semiconductor element of the invention.

Furthermore, the optical waveguide in a semiconductor element can be a waveguide formed by diffusion from a strip containing germanium into the silicon layer. A corresponding method for manufacturing such an optical waveguide is described in U.S. patent application Ser. No. 07/781,249 filed on Dec. 30, 1991 and entitled "PROCESS FOR PRODUCING A LOW-PASS OPTICAL WAVEGUIDE IN AN EPITAXIAL SILICON FILM".

In another embodiment of present invention, the optical waveguide is a rib of a germanium-silicon layer on the silicon layer.

In another embodiment of the present invention, the optical waveguide is a rib in a weakly doped epitaxial silicon layer with an insulating silicon dioxide intermediate layer on a silicon substrate.

In the semiconductor element of the present invention, the germanium-rich layer is in the outside surface of the semiconductor element which has the waveguide. This makes it possible for photons in the optical waveguide to cause electron hole pairs in this layer, because the germanium-rich layer is located in the immediate vicinity of the optical waveguide.

The germanium-rich layer can be essentially monocrystalline. In some cases, it can also be advantageous if the germanium-rich layer is a layer evaporated onto the silicon layer in a high vacuum and subjected to a subsequent tempering process.

It is also advantageous if the germanium content of the germanium-rich layer is greater than 85%.

With this germanium content, the wavelength range $\lambda = 1.3$ to $1.55$ $\mu m$ is of particular interest for optical communications technology, and an absorption in the germanium-rich layer can be achieved for this wavelength range.

The germanium-rich layer can be structured to be very thin. In order to reduce border surface effects, the thickness of the germanium-rich layer should be between 10 nm and 1000 nm.

The diode structure can be formed in different ways in the semiconductor element according to the invention. For example, the diode structure can be formed as a pin diode.

However, a diode structure which is implemented as at least one Schottky diode is also possible for the semiconductor element of the invention.

In the semiconductor element of the invention, it is advantageous if the external conductive contacts are formed as contact strips which run parallel to the optical waveguide.

A distance between the contact strips of 5 to 10 μm has proven to be advantageous. The length of the contact strips is advantageously between 100 and 500 μm.

In the structure of the external conductive contacts as just indicated, it is advantageous if the germanium-rich layer extends from the waveguide to below the contact strips, when arranged on the outside surface of the silicon layer which carries the waveguide.

DETAILED DESCRIPTION

Figure 1:
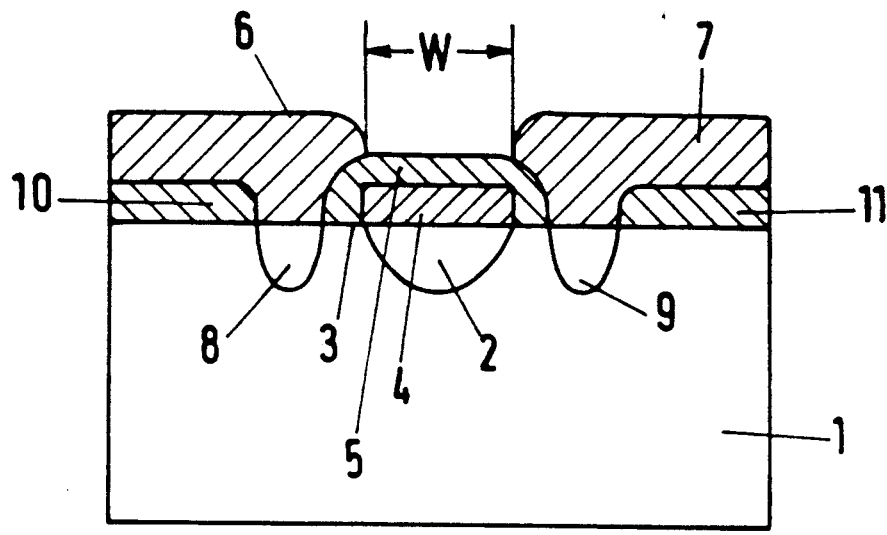
FIG. 1 is a cross-sectional view of an embodiment of the semiconductor element according to the invention having a waveguide diffused into a silicon layer.

In the embodiment shown in FIG. 1, a waveguide 2 is formed in a weakly doped silicon layer 1, by diffusion from a strip containing germanium, pursuant to U.S. patent application Ser. No. 07/781,249, cited above, at the surface 3 of the silicon layer 1. In the region of the waveguide 2, a germanium-rich layer 4 is applied to the surface 3 of the silicon layer 1. This layer 4 is covered with a silicon dioxide layer 5, so that the germanium-rich layer 4 is insulated with regard to external conductive contacts 6 and 7 on the surface 3 of the silicon layer 1.

In the embodiment of the semiconductor element according to the invention as shown in FIG. 1, electron hole pairs occur in the germanium-rich layer 4 due to an optical field in the optical waveguide 2, which results in a current through the conductive contacts 6 and 7 due to the pin diode structure. The width, W, of the optical waveguide 2 lies in the range of a few μm, so that the distance between the conductive contacts 6 and 7, which extend perpendicular to the plane of the drawing as contact strips, lies between about 5 and 10 μm.

Figure 2:
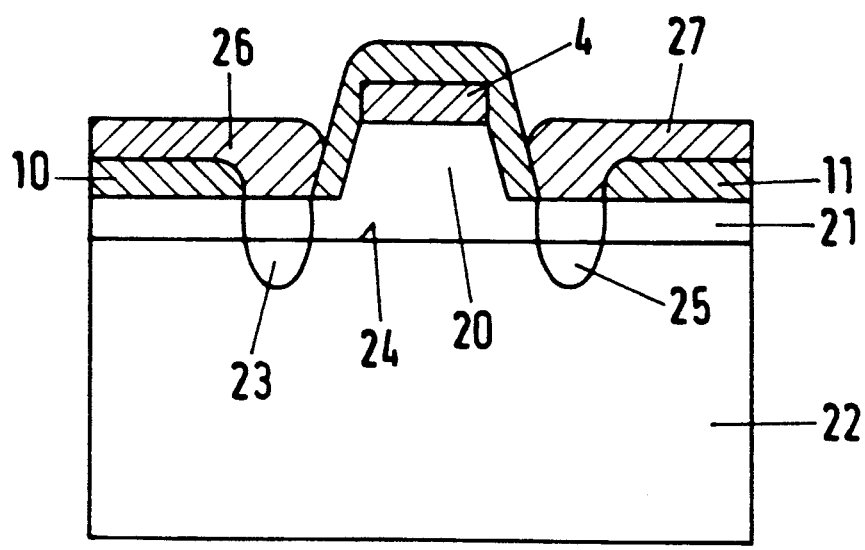
FIG. 2 is a cross-sectional view of another embodiment of the present invention, where the semiconductor element has a waveguide formed by a rib of a layer containing germanium.

The embodiment of FIG. 2 differs from that shown in FIG. 1 in that the optical waveguide is formed by a rib 20 of a layer 21 containing germanium, which is applied to a weakly doped silicon layer 22 corresponding to the silicon layer 1 pursuant to the embodiment shown in FIG. 1. In this embodiment, a p+ region 23 extends from the surface 24 of the silicon layer 22 through the germanium containing layer 21, into the silicon layer 22. Corresponding to this, a n+ region 25 is formed. In this embodiment, also, the regions 23 and 25 form a pin diode with the germanium-rich layer 24 and the rib 20, via which a current flows through the external conductive contacts 26 and 27, due to the electron hole pairs formed in the germanium-rich layer 4 by an optical field. The current flowing through the external conductive contacts 26 and 27 represents a measure of the optical field.

Figure 3:
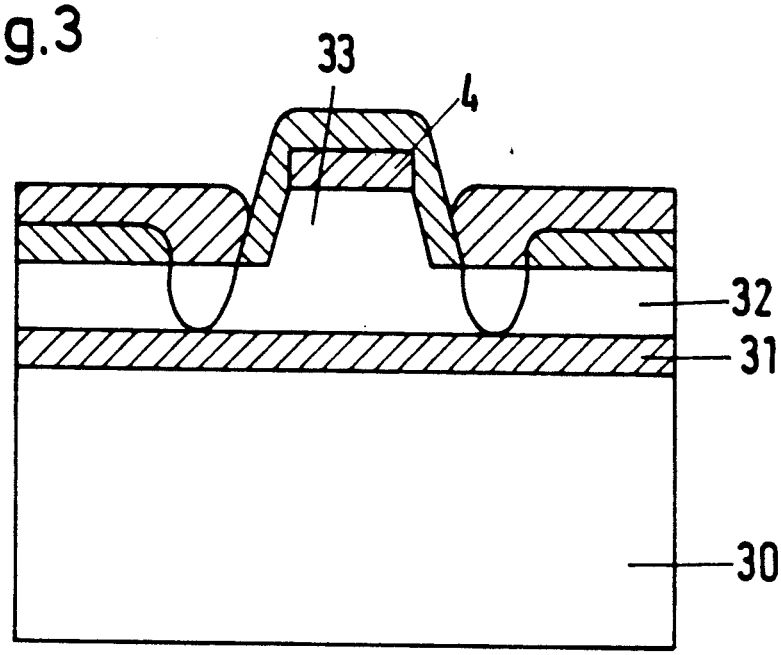
FIG. 3 is a cross-sectional view of an additional embodiment where a waveguide is formed by a rib of a layer containing germanium on a silicon dioxide intermediate layer of a silicon substrate.

The embodiment shown in FIG. 3 differs from that shown in FIG. 2 in that a silicon dioxide layer 31 is applied, for insulation between a silicon substrate 30, which is doped in any desired manner, and a weakly doped monocrystalline silicon layer 32. A rib 33 of the silicon layer 32 forms the optical waveguide. For the remainder of this embodiment, the structure is comparable with that shown in FIG. 2.

Figure 4:
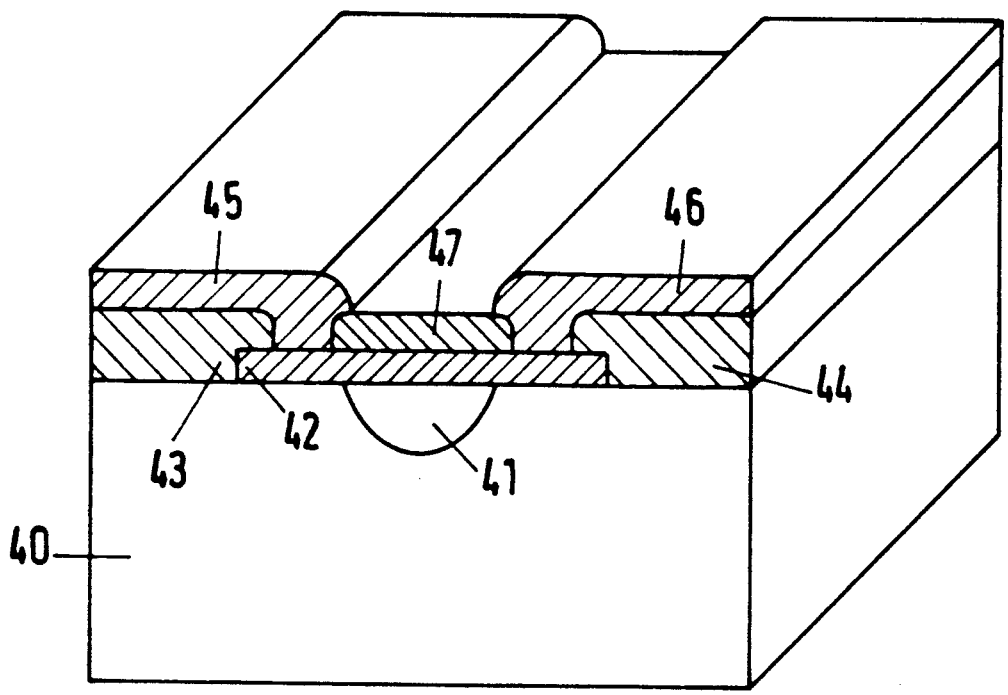
FIG. 4 is a cross-sectional view of another embodiment having two Schottky diodes switched in opposite directions.

In the embodiment of FIG. 4, a waveguide 41 is first formed on a weakly doped silicon layer 40, by diffusion in the manner described above with reference to FIG. 1. Extending over the region of the waveguide 41, a germanium-rich layer 42 is drawn, which extends into the region of insulating silicon dioxide layers 43 and 44. These layers 43 and 44 insulate conductive contacts 45 and 46 with respect to the silicon layer 40. In the region above the waveguide 41, a further silicon dioxide layer 47 is applied for insulation. In this embodiment, the transition between the conductive contact 45, the germanium-rich layer 42 and the silicon layer 40, as well as the transition between the silicon layer 40, the germanium-rich layer 42 and the conductive contact 46, represents a Schottky contact in each case, so that two Schottky diodes switched in opposite directions are formed between the conductive contacts 45 and 46, one of which is always operated in the blocking direction, and the other in the flow direction.

As FIG. 4 clearly shows, the optical waveguide 41 as well as the external conductive contacts 45 and 46 are structured in strip form. The conductive contacts 45 and 46 typically have a length between 100 and 500 μm, depending on the absorption.

In the embodiment shown, with the germanium-rich layer 42 reaching up to the conductive contacts 45 and 46, the current flow between the contacts 45 and 46 can be essentially limited to the germanium-rich layer 42. In principle, however, it is also possible to dispose the germanium-rich layer 42 only in the region of the waveguide 41.

What is claimed is:

1. An optoelectronic semiconductor element, comprising:
   a silicon layer having a surface;
   an optical waveguide weakly doped within said silicon layer and coupled to the surface of said silicon layer;
   a diode structure disposed on the surface of said silicon layer and coupled in close proximity to said optical waveguide such that said diode structure is capable of being influenced by electron hole pairs caused by photons in said optical waveguide, a said diode structure comprising:
   a germanium-rich layer coupled to the surface of said silicon layer and coupled to said optical waveguide, said germanium-rich layer producing said electron hole pairs caused by photons in said optical waveguide;
   first and second conductive contacts coupled to the surface of said silicon layer and said diode structure.

2. The semiconductor element of claim 1, wherein said diode structure extends perpendicular to said optical waveguide along the surface of said silicon layer.

3. The semiconductor element of claim 1, wherein said optical waveguide is formed in said silicon layer by diffusion from a germanium containing strip.

4. The semiconductor element of claim 1, wherein said germanium-rich layer is substantially monocrystalline.

5. The semiconductor element of claim 4, wherein said germanium-rich layer is evaporated onto said silicon layer in a high vacuum while said silicon layer is heated.

6. The semiconductor element of claim 4, wherein said germanium-rich layer is evaporated onto said silicon layer in a high vacuum and is subsequently subjected to a tempering process.

7. The semiconductor element of claim 1, wherein said germanium-rich layer comprises at least 85% germanium.

8. The semiconductor element of claim 1, wherein said germanium-rich layer has a thickness between 10 nm and 1000 nm.

9. The semiconductor element of claim 1, wherein said diode structure is a pin diode.

10. The semiconductor element of claim 1, wherein said first and second conductive contacts comprise contact strips running parallel to said optical waveguide.

11. The semiconductor element of claim 10, wherein said contact strips have a length between 100 $\mu$m and 500 $\mu$m and a distance separating said contact strips between 5 $\mu$m and 10 $\mu$m.

12. An optoelectronic semiconductor element, comprising:
   a silicon layer;
   a germanium-silicon layer having a surface and disposed on said silicon layer, said germanium-silicon layer having a rib operating as an optical waveguide;
   a diode structure disposed on the surface of said germanium-silicon layer and coupled in close proximity to said optical waveguide such that said diode structure is capable of being influenced by electron hole pairs caused by photons in said optical waveguide, said diode structure comprising:
   a germanium-rich layer coupled to the optical waveguide of said germanium-silicon layer, said germanium-rich layer producing said electron hole pairs caused by photons in said optical waveguide;
   first and second conductive contacts coupled to the surface of said germanium-silicon layer and said diode structure.

13. The semiconductor element of claim 12, wherein said diode structure extends perpendicular to said optical waveguide along the surface of said germanium-silicon layer.

14. The semiconductor element of claim 12, wherein said germanium-rich layer is substantially monocrystalline.

15. The semiconductor element of claim 14, wherein said germanium-rich layer is evaporated onto said silicon layer in a high vacuum while said silicon layer is heated.

16. The semiconductor element of claim 14, wherein said germanium-rich layer is evaporated onto said germanium-silicon layer in a high vacuum and is subsequently subjected to a tempering process.

17. The semiconductor element of claim 12, wherein said germanium-rich layer comprises at least 85% germanium.

18. The semiconductor element of claim 12, wherein said germanium-rich layer has a thickness between 10 nm and 100- nm.

19. The semiconductor element of claim 12, wherein said diode structure is a pin diode.

20. The semiconductor element of claim 12, wherein said first and second conductive contacts comprise contact strips running parallel to said optical waveguide.

21. The semiconductor element of claim 20, wherein said contact strips have a length between 100 $\mu$m and 500 $\mu$m and a distance separating said contact strips between 5 $\mu$m and 10 $\mu$m.

22. An optoelectronic semiconductor element, comprising:
   a first silicon layer;
   a silicon dioxide layer disposed on top of said silicon layer;
   a second, weakly doped and monocrystalline silicon layer disposed on top of said silicon dioxide layer, said second silicon layer having a surface and a rib operating as an optical waveguide;
   a diode structure disposed on the surface of said second silicon layer and coupled in close proximity to said rib operating as an optical waveguide such that said diode structure is capable of being influenced by electron hole pairs caused by photons in said optical waveguide, said diode structure comprising:
   a germanium-rich layer coupled to the optical waveguide of said second silicon layer, said germanium-rich layer producing said electron hole pairs caused by photons in said optical waveguide;
   first and second conductive contacts coupled to the surface of said second silicon layer and said diode structure.

23. The semiconductor element of claim 22, wherein said diode structure extends perpendicular to said optical waveguide along the surface of said second silicon layer.

24. The semiconductor element of claim 22, wherein said germanium-rich layer is substantially monocrystalline.

25. The semiconductor element of claim 24, wherein said germanium-rich layer is evaporated onto said silicon layer in a high vacuum while said silicon layer is heated.

26. The semiconductor element of claim 24, wherein said germanium-rich layer is evaporated onto said second silicon layer in a high vacuum and is subsequently subjected to a tempering process.

27. The semiconductor element of claim 22, wherein said germanium-rich layer comprises at least 85% germanium.

28. The semiconductor element of claim 22, wherein said germanium-rich layer has a thickness between 10 nm and 100 nm.

29. The semiconductor element of claim 22, wherein said diode structure is a pin diode.

30. The semiconductor element of claim 22, wherein said first and second conductive contacts comprise contact strips running parallel to said optical waveguide.

31. The semiconductor element of claim 30, wherein said contact strips have a length between 100 $\mu$m and 500 $\mu$m and a distance separating said contact strips between 5 $\mu$m and 10 $\mu$m.

32. An optoelectronic semiconductor element, comprising:
   a silicon layer having a surface;

a optical waveguide weakly doped within said silicon layer and coupled to the surface of said silicon layer;

a diode structure disposed on the surface of said silicon layer and coupled in close proximity to said optical waveguide such that said diode structure is capable of being influenced by electron hole pairs caused by photons in said optical waveguide, said diode structure comprising a germanium-rich layer coupled to the surface of said silicon layer and coupled to said optical waveguide, said germanium-rich layer producing said electron hole pairs caused by photons in said optical waveguide, said germanium-rich layer having a width larger than a width of said optical waveguide;

first and second silicon dioxide layers disposed on top of said silicon layer, said first and second silicon dioxide layers partially covering said germanium-rich layer;

a first conductive contact coupled to said first silicon dioxide layer and said germanium-rich layer; and a second conductive contact coupled to said second silicon dioxide layer and said germanium-rich layer.

33. The semiconductor element of claim 32, wherein said diode structure comprises at least one Schotty diode.

* * * * *